US010283734B2

(12) United States Patent
Yim et al.

(10) Patent No.: US 10,283,734 B2
(45) Date of Patent: May 7, 2019

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Sang Hoon Yim, Suwon-si (KR); Dong Chan Kim, Hwaseong-si (KR); Won Jong Kim, Suwon-si (KR); Eung Do Kim, Seoul (KR); Dong Kyu Seo, Suwon-si (KR); Jong Hyuk Lee, Seoul (KR); Da Hea Im, Incheon (KR); Yoon Hyeung Cho, Yongin-si (KR); Chang Woong Chu, Hwaseong-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/877,955

(22) Filed: Oct. 8, 2015

(65) Prior Publication Data
US 2016/0155979 A1 Jun. 2, 2016

(30) Foreign Application Priority Data

Nov. 28, 2014 (KR) ........................ 10-2014-0168660

(51) Int. Cl.
H01L 51/52 (2006.01)
(52) U.S. Cl.
CPC ...... H01L 51/5281 (2013.01); H01L 51/5275 (2013.01); H01L 2251/55 (2013.01); H01L 2251/558 (2013.01)

(58) Field of Classification Search
CPC ........... H01L 2251/55; H01L 2251/558; H01L 51/5275; H01L 51/5281
USPC ....... 257/40, 88, 89; 313/512, 506; 428/212; 1/1
See application file for complete search history.

(56) References Cited

U.S. PATENT DOCUMENTS

| 8,482,195 | B2 * | 7/2013 | Mizuno | H01L 27/3211 313/506 |
| 8,680,543 | B2 * | 3/2014 | Takeda | H01L 51/5262 257/40 |
| 8,698,395 | B2 | 4/2014 | Im et al. | |
| 2004/0021415 | A1 * | 2/2004 | Vong | H05B 33/22 313/509 |
| 2004/0075382 | A1 * | 4/2004 | Stegamat | H01L 51/5234 313/506 |
| 2006/0113907 | A1 * | 6/2006 | Im | H01L 51/5253 313/512 |

(Continued)

FOREIGN PATENT DOCUMENTS

KR 10-2006-0020050 A 3/2006
KR 10-2007-0085377 A 8/2007

(Continued)

Primary Examiner — Mohammed Shamsuzzaman
(74) Attorney, Agent, or Firm — Lee & Morse P.C.

(57) ABSTRACT

An organic light emitting diode display, including a substrate; a thin film transistor on the substrate; a first electrode on the thin film transistor and electrically connected to the thin film transistor; an organic emission layer on the first electrode; a second electrode on the organic emission layer; and a first capping layer on the second electrode and a second capping layer on the first capping layer, the second capping layer being thicker than the first capping layer.

8 Claims, 8 Drawing Sheets

(56) References Cited

U.S. PATENT DOCUMENTS

| | | | | |
|---|---|---|---|---|
| 2006/0261727 A1* | 11/2006 | Aziz | .................... | H01L 51/5284 |
| | | | | 313/503 |
| 2006/0269731 A1* | 11/2006 | Yoshikawa | ....... | B32B 17/10018 |
| | | | | 428/212 |
| 2010/0001272 A1* | 1/2010 | Ye | .................... | H01L 21/02521 |
| | | | | 257/57 |
| 2011/0121271 A1* | 5/2011 | Jeon | .................... | H01L 51/5253 |
| | | | | 257/40 |
| 2011/0204388 A1* | 8/2011 | Jeong | .................. | H01L 51/5281 |
| | | | | 257/88 |
| 2015/0123086 A1* | 5/2015 | Lee | .................... | H01L 51/5275 |
| | | | | 257/40 |
| 2015/0187847 A1* | 7/2015 | Choi | .................. | H01L 27/3211 |
| | | | | 257/40 |
| 2016/0049613 A1* | 2/2016 | Kang | .................. | H01L 51/5271 |
| | | | | 257/40 |
| 2016/0099438 A1* | 4/2016 | Cho | .................... | H01L 27/3244 |
| | | | | 257/40 |
| 2016/0164039 A1* | 6/2016 | Im | ...................... | H01L 51/0058 |
| | | | | 257/40 |
| 2016/0308162 A1* | 10/2016 | Yoo | .................... | H01L 27/3244 |

FOREIGN PATENT DOCUMENTS

| | | |
|---|---|---|
| KR | 10-2007-0103463 A | 10/2007 |
| KR | 10-2013-0037445 A | 4/2013 |
| KR | 10-2014-0069711 A | 6/2014 |

\* cited by examiner

ORGANIC LIGHT EMITTING DIODE DISPLAY

CROSS-REFERENCE TO RELATED APPLICATION

Korean Patent Application No. 10-2014-0168660, filed on Nov. 28, 2014, in the Korean Intellectual Property Office, and entitled: "Organic Light Emitting Diode Display," is incorporated by reference herein in its entirety.

BACKGROUND

1. Field

Provided is an organic light emitting diode display.

2. Description of the Related Art

An organic light emitting diode (OLED) display is a self-emissive display that displays an image with an organic light emitting element emitting light.

SUMMARY

Embodiments may be realized by providing an organic light emitting diode display, including a substrate; a thin film transistor on the substrate; a first electrode on the thin film transistor and electrically connected to the thin film transistor; an organic emission layer on the first electrode; a second electrode on the organic emission layer; and a first capping layer on the second electrode and a second capping layer on the first capping layer, the second capping layer being thicker than the first capping layer.

The first capping layer may include an organic layer with a thickness of 200-1,000 Å, and the second capping layer may include the organic layer with a thickness of 4,000-10,000 Å.

The first capping layer may have a thickness of 400-500 Å, and the second capping layer may have a thickness of 4,500-6,500 Å.

The first capping layer may have a refractive index of 1-1.4, and the second capping layer may have a refractive index of 1.5-2.5.

The first capping layer may have a refractive index of 1.2-1.3, and the second capping layer may have a refractive index of 1.8-2.0.

The organic emission layer may include a hole injection layer and a hole transferring layer on the first electrode, an emission layer on the hole transferring layer, and an electron transferring layer and an electron injection layer on the emission layer.

The first electrode may be an anode, and the second electrode may be a cathode.

The organic light emitting diode display may further include a third capping layer formed between the first capping layer and the second capping layer.

The second capping layer may be thicker than the third capping layer.

The thickness of the second capping layer may be larger than a sum of the thickness of the first capping layer and the third capping layer.

The first capping layer may have a thickness of 200-1,000 Å, the second capping layer may have a thickness of 4,000-10,000 Å, and the third capping layer may have a thickness of 500-1,500 Å.

The first capping layer may have a thickness of 400-500 Å, the second capping layer may have a thickness of 4,500-6,500 Å, and the third capping layer may have a thickness of 1,000-1,300 Å.

A refractive index of the first capping layer and the second capping layer may be 1.5-2.5, and a refractive index of third capping layer may be 1-1.4.

The refractive index of the first capping layer and the second capping layer may be 1.8-2.0, and the refractive index of the third capping layer may be 1.2-1.3.

The organic emission layer may include a hole injection layer and a hole transferring layer on the first electrode, an emission layer on the hole transferring layer, and an electron transferring layer and an electron injection layer on the emission layer.

The first electrode may be an anode, and the second electrode may be a cathode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
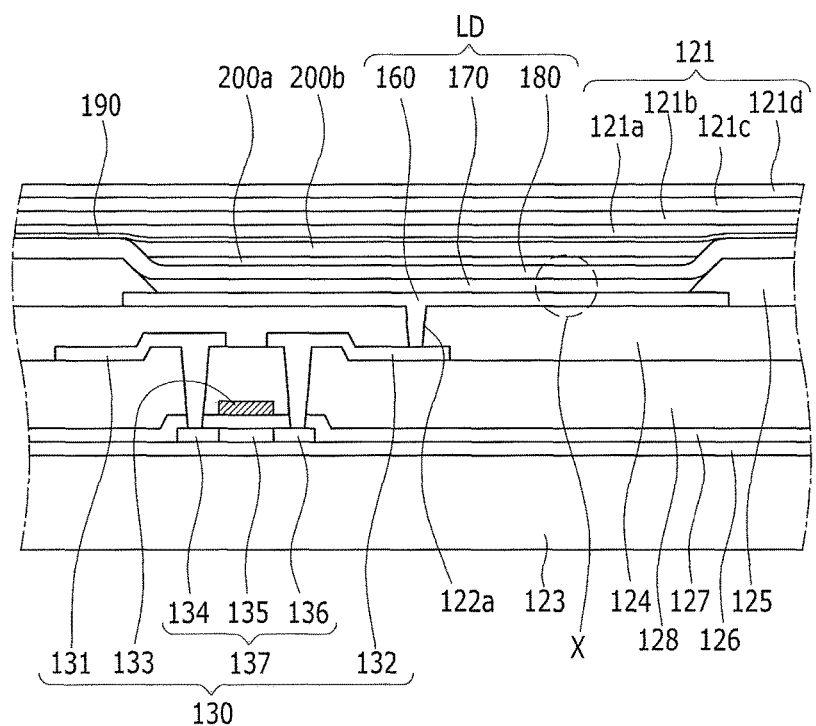
FIG. 1 illustrates a cross-sectional view of an organic light emitting diode (OLED) display based on a thin film transistor and an organic light emitting element used therein in accordance with an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

An organic light emitting diode display according to an exemplary embodiment will be described with reference to accompanying drawings. The structure of the organic light emitting diode display may include a structure of the driving thin film transistor and the emission layer.

Figure 2:
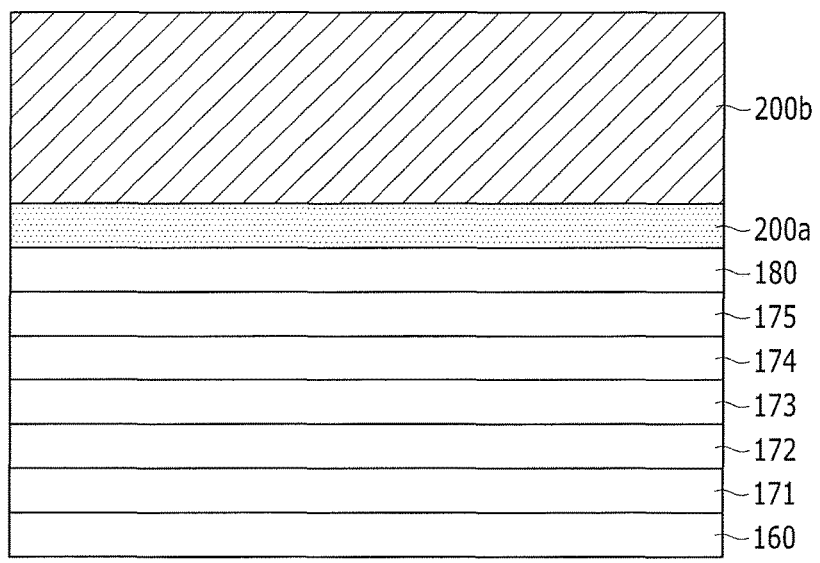
FIG. 2 illustrates a partially enlarged cross-sectional view of a part of an organic light emitting element shown in FIG. 1.

Referring to FIG. 1 and FIG. 2, an organic light emitting diode display according to an exemplary embodiment may include a substrate 123, a thin film transistor 130, a first electrode 160, first layers 171 and 172, an emission layer 173, second layers 174 and 175, a second electrode 180, and a first capping layer 200a and a second capping layer 200b formed on the second electrode 180.

The first layers 171 and 172 may include a hole injection layer 171 and a hole transferring layer 172, and the second layers 174 and 175 may include an electron transferring layer 174 and an electron injection layer 175.

The substrate 123 may be formed as an insulating substrate made of, for example, glass, quartz, ceramics, metal, or plastic. In an exemplary embodiment, the substrate 123 may be formed of a metallic substrate made of a stainless steel.

A substrate buffer layer 126 may be formed on the substrate 123. The substrate buffer layer 126 may prevent penetration of impurities and may planarize the surface.

The substrate buffer layer 126 may be made of various materials capable of performing the functions. For example, one of a silicon nitride ($SiN_x$) layer, a silicon oxide ($SiO_x$) layer, and a silicon oxynitride ($SiO_xN_y$) layer may be used as the substrate buffer layer 126. In an exemplary embodiment, the substrate buffer layer 126 may be omitted according to the substrate 123, e.g., a kind of substrate 123, and a process condition.

A driving semiconductor layer 137 may be formed on the substrate buffer layer 126. The driving semiconductor layer 137 may be formed as a polysilicon layer. The driving semiconductor layer 137 may include a channel region 135 in which impurities are not doped, and a source region 134 and a drain region 136 in which the impurities are doped at respective sides of the channel region 135. The doped ion materials may be P-type impurities such as boron (B), and $B_2H_6$ may be used. The impurities may vary according to the thin film transistor, e.g., a kind of thin film transistor.

A gate insulating layer 127 made of a silicon nitride ($SiN_x$) or a silicon oxide ($SiO_x$) may be formed on the driving semiconductor layer 137. A gate wire including a driving gate electrode 133 may be formed on the gate insulating layer 127. The driving gate electrode 133 may be formed to overlap at least a part of the driving semiconductor layer 137, for example, the channel region 135.

An interlayer insulating layer 128 covering the driving gate electrode 133 may be formed on the gate insulating layer 127. Contact holes exposing the source region 134 and the drain region 136 of the driving semiconductor layer 137 may be formed in the gate insulating layer 127 and the interlayer insulating layer 128. The interlayer insulating layer 128 may be formed by using a ceramic-based material such as a silicon nitride ($SiN_x$) or a silicon oxide ($SiO_x$), like the gate insulating layer 127.

A data wire including a driving source electrode 131 and a driving drain electrode 132 may be formed on the interlayer insulating layer 128. The driving source electrode 131 and the driving drain electrode 132 may be connected with, e.g., to, the source region 134 and the drain region 136 of the driving semiconductor layer 137 through the contact holes 128a formed in the interlayer insulating layer 128 and the gate insulating layer 127, respectively.

A driving thin film transistor 130 including the driving semiconductor layer 137, the driving gate electrode 133, the driving source electrode 131, and the driving drain electrode 132 may be formed. The configuration of the driving thin film transistor 130 may be variously modified as a configuration that may be implemented by those skilled in the art.

A planarization layer 124 covering the data wire may be formed on the interlayer insulating layer 128. The planarization layer 124 may remove and planarize a step to increase emission efficiency of the organic light emitting element to be formed thereon. The planarization layer 124 may have an electrode via hole 122a exposing a part of the drain electrode 132.

The planarization layer 124 may be made of one or more materials of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In an exemplary embodiment, one of the planarization layer 124 and the interlayer insulating layer 128 may be omitted.

A first electrode of the organic light emitting element, for example, a pixel electrode 160, may be formed on the planarization layer 124. For example, the organic light emitting diode device may include a plurality of pixel electrodes 160 which may be disposed for every plurality of pixels, respectively. The plurality of pixel electrodes 160 may be spaced apart from each other. The pixel electrode 160 may be connected to the drain electrode 132 through the electrode via hole 122a of the planarization layer 124.

A pixel defining layer 125 having an opening exposing the pixel electrode 160 may be formed on the planarization layer 124. For example, the pixel defining layer 125 may have a plurality of openings formed for each pixel. The organic emission layer 170 may be formed for each opening formed by the pixel defining layer 125, and a pixel area in which each organic emission layer may be formed by the pixel defining layer 125 may be defined.

The pixel electrode 160 may be disposed to correspond to the opening of the pixel defining layer 125. In an exemplary embodiment, the pixel electrode 160 may not be disposed only in the opening of the pixel defining layer 125, and may be disposed below the pixel defining layer 125, and a part of the pixel electrode 160 may overlap with the pixel defining layer 125.

The pixel defining layer 125 may be made of resin such as, for example, a polyacrylate resin and a polyimide, or a silica-based inorganic material.

An organic emission layer 170 may be formed on the pixel electrode 160.

A second electrode, for example, a common electrode 180, may be formed on the organic emission layer 170.

The first capping layer 200a and the second capping layer 200b may be formed on the second electrode 180.

The structure of the organic emission layer 170, the first capping layer 200a, and the second capping layer 200b will be described in detail later.

The organic light emitting diode LD including the pixel electrode 160, the organic emission layer 170, the common electrode 180, and the first and second capping layers 200a and 200b may be formed.

Each of the pixel electrode 160 and the common electrode 180 may be made of a transparent conductive material or a transflective or reflective conductive material. According to the materials forming the pixel electrode 160 and the common electrode 180, e.g., a kind of materials forming the pixel electrode 160 and the common electrode 180, the organic light emitting diode device may be a top emission type, a bottom emission type, or a double-sided emission type.

The first capping layer 200a and the second capping layer 200b may be formed of an organic layer.

An overcoat 190 covering and protecting the common electrode 180 may be formed on the first capping layer 200a, the second capping layer 200b, and the common electrode 180.

A thin film encapsulation layer 121 may be formed on the overcoat 190. The thin film encapsulation layer 121 may encapsulate and protect the organic light emitting element LD and a driving circuit part formed on the substrate 123 from the outside.

The thin film encapsulation layer 141 may include organic encapsulation layers 121a and 121c and inorganic encapsulation layers 121b and 121d which may be alternately laminated. For example, FIG. 1 illustrates an exemplary embodiment in which two organic encapsulation layers 121a and 121c and two inorganic encapsulation layers 121b and 121d may be alternately laminated to configure the thin film encapsulation layer 12.

The organic light emitting element will be described with reference to FIG. 2. FIG. 2 is an enlarged cross-sectional view of a portion of the organic light emitting element of FIG. 1.

The organic light emitting element (a portion X of FIG. 1) according to an exemplary embodiment may have a structure in which the first electrode 160, the hole injection layer 171, the hole transferring layer 172, the emission layer 173, the electron transferring layer 174, the electron injection layer 175, the second electrode 180, the first capping layer 200a, and the second capping layer 200b are sequentially laminated.

For example, the organic emission layer 170 of FIG. 1 may include the first electrode 160, the hole injection layer 171, the hole transferring layer 172, the emission layer 173, the electron transferring layer 174, the electron injection layer 175, the second electrode 180, the first capping layer 200a, and the second capping layer 200b of FIG. 2.

The first electrode 160 may be the anode, and the second electrode 180 may be the cathode.

The hole injection layer 171 may be disposed on the first electrode 160. The hole injection layer 171 may be a layer that may improve the injection of holes from the first electrode 160 into the hole transferring layer 172. The hole injection layer 171 may be formed of, for example, copper phthalocyanine (CuPc), poly(3,4-ethylenedioxythiophene) (PEDOT), polyaniline (PANI), or N,N'-diphenyl-N,N'-di-[4-(N,N-diphenyl-amino)phenyl]benzidine (NPNPB).

The thickness of the hole injection layer 171 may be in a range of 25 μm to 35 μm.

The hole injection layer 171 may be disposed on the hole transferring layer 172. The hole transferring layer 172 may facilitate smooth transport of the holes transferred from the hole injection layer 171. For example, the hole transferring layer 172 may be formed of N,N-di(1-naphthyl)-N,N'-di (phenyl)benzidine (NPD), N,N'-bis(3-methylphenyl)-N,N'-bis(phenyl) (TPD), s-TAD, or 4,4',4''-tris(N-3-methylphenyl-N-phenyl-amino)-triphenylamine (MTDATA).

In an exemplary embodiment, the hole injection layer 171 may include a material applied with the dopant of the P type to the same material as the material included in the hole transferring layer 172, the driving voltage of the organic light emitting element may be decreased, and the hole injection characteristic may be improved.

The thickness of the hole transferring layer 172 may be in a range of 15 nm to 25 nm.

In the present exemplary embodiment, the hole injection layer 171 and the hole transferring layer 172 may have the laminated structure. In an exemplary embodiment, the hole injection layer 171 and the hole transferring layer 172 may be formed of a singular layer.

The emission layer 173 may contain a light emitting material for displaying a predetermined color. For example, the emission layer 173 may display a primary color such as blue, green, or red, or a combination thereof.

The thickness of the emission layer 173 maybe in a range of 15 μm to 25 μm.

The emission layer 173 may contain a host and a dopant. The emission layer 173 may contain materials for emitting red, green, blue, and white light, and may be formed by using a phosphorescent or fluorescent material.

In a case where the emission layer 173 emits red light, it may contain a host material having carbazole biphenyl (CBP) or 1,3-bis(carbazol-9-yl) (mCP), and may be formed of a phosphorescent material containing a dopant having at least one of, for example, PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (platinum octaethylporphyrin).

In a case where the emission layer 173 emits green light, it may contain a host material having CBP or mCP, and may be formed of a phosphorescent material containing a dopant having Ir(ppy)3 (fac-tris(2-phenylpyridine)iridium) or a phosphorescent material containing a dopant having Alq3 (tris(8-hydroxyquinolino)aluminum).

In a case where the emission layer 173 emits green light, it may contain a host material having CBP or mCP, and may be formed of a phosphorescent material containing a dopant (4,6-F2ppy)2Irpic. In an exemplary embodiment, the emission layer 173 may be formed of a phosphorescent material containing one of spiro-DPVBi, spiro-6P, distyryl benzene (DSB), distyryl arylene (DSA), a PFO-based polymer, and a PPV-based polymer.

In an exemplary embodiment, the electron transferring layer 174 may be disposed on the emission layer 173. The electron transferring layer 174 may facilitate transfer of electrons from the second electrode 180 to the emission layer 173. The electron transferring layer 174 may prevent the holes injected from the first electrode 160 from moving to the second electrode 180 through the emission layer 173. For example, the electron transferring layer 174 may serve as a hole blocking layer to improve combination of the holes and electrons in the emission layer 173.

The electron transferring layer 174 may be formed of one of, for example, Alq3 (tris(8-hydroxyquinolino)aluminum), PBD, TAZ, Spiro-PBD, BAlq, and SAlq.

The electron injection layer 175 may be formed on the electron transferring layer 174. The electron injection layer 175 may be a layer that may improve the injection of the electrons from the second electrode 180 into the electron transferring layer 174. The electron injection layer 175 may include, for example, Alq3, LiF, gallium mixture (Ga complex), or PBD.

The second electrode 180 may be formed on the electron injection layer 175. On the second electrode 180, the first capping layer 200a and the second capping layer 200b may be sequentially deposited at the position corresponding to the organic emission layer 170.

Referring to the first capping layer 200a, the first capping layer 200a may be formed of the organic layer, and the first capping layer 200a may be formed of the organic layer having a refractive index of, for example, 1-1.4, e.g., 1.2-1.3.

The first capping layer 200a may be formed with a thickness of, for example, 200-1,000 Å, e.g., 400-500 Å.

Referring to the second capping layer 200b, the second capping layer 200b may also be formed of the organic layer, and the second capping layer 200b may be formed of the organic layer having a refractive index of, for example, 1.5-2.5, e.g., 1.8-2.0.

The second capping layer 200b may be relatively thicker than the first capping layer 200a, with a thickness of, for example, 4,000-10,000 Å, e.g., 4,500-6,500 Å.

The following Examples and Comparative Example are provided in order to highlight characteristics of one or more embodiments, but it will be understood that the Examples and Comparative Example are not to be construed as limiting the scope of the embodiments, nor is the Comparative Example to be construed as being outside the scope of the embodiments. Further, it will be understood that the embodiments are not limited to the particular details described in the Examples and Comparative Example.

A function of the first capping layer and the second capping layer according to an exemplary embodiment will be described with reference to FIGS. 3A and 3B.

Figure 3A:
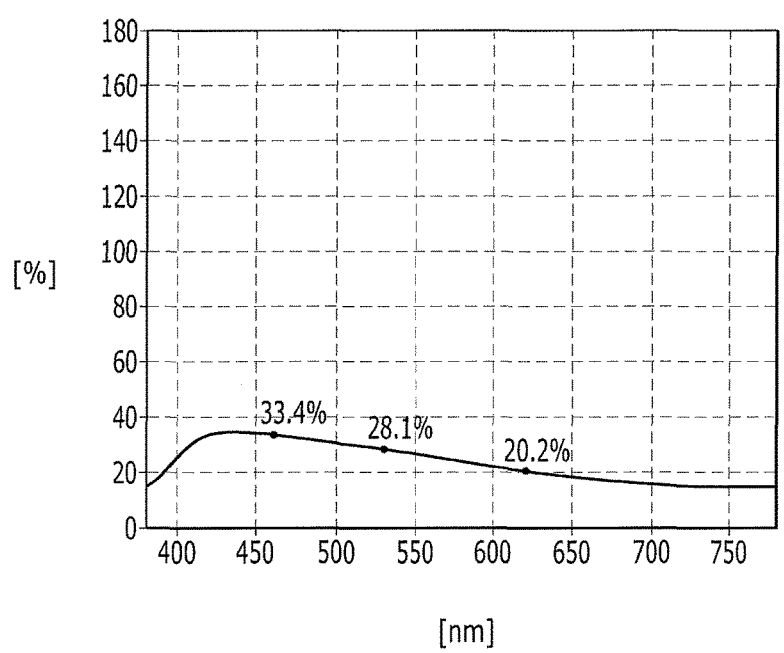
FIG. 3A and FIG. 3B illustrate graphs of results of measuring reflectance of a light for each wavelength of an organic light emitting element according to a Comparative Example and an Example, respectively.
Figure 3B:
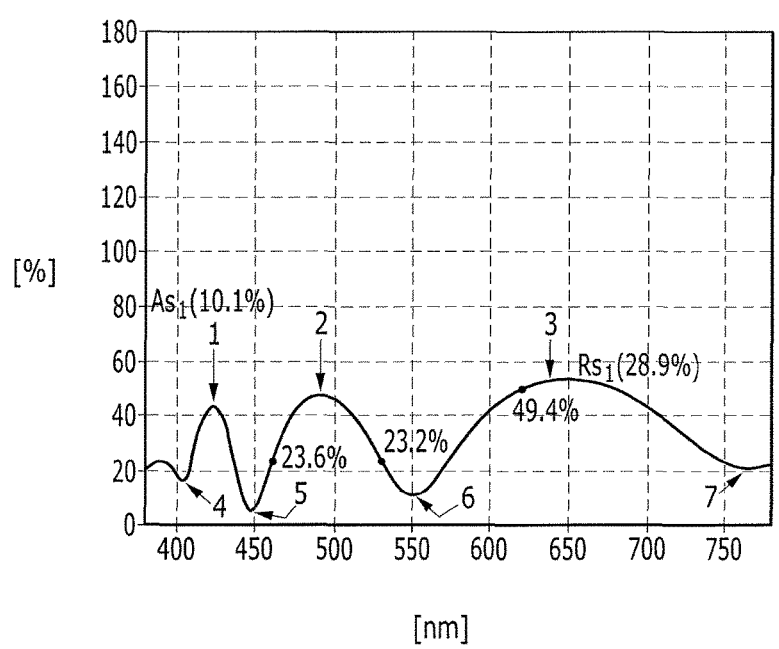

FIG. 3A and FIG. 3B illustrate graphs of result of measuring a reflectance of a light for each wavelength of an organic light emitting element according to a Comparative Example and an Example, respectively.

The Comparative Example used the organic light emitting element in which the second capping layer 200b was omitted, i.e., only the first capping layer 200a was formed in the organic light emitting element. In FIG. 3A and FIG. 3B, a horizontal axis represents a wavelength band (nm) of light and a vertical axis represents reflectance (%) of the light.

Referring to FIG. 3A, in the Comparative Example, the reflection for the light of the entire wavelength band region was relatively uniform throughout a blue wavelength band (400-460 nm), a green wavelength band (500-600 nm), and a red wavelength band (600-680 nm).

Referring to FIG. 3B, in the Example, in which the second capping layer 200b was formed on the first capping layer 200a in the organic light emitting element, a graph representing the reflectance of the light included antinodes 1, 2, and 3 in blue, green, and red wavelength regions required in the blue wavelength band, the green wavelength band, and the red wavelength band, and the graph representing the reflectance of the light in the rest of the wavelength region except for the blue, green, and red wavelengths included nodes 4, 5, 6, and 7, and the light of the required blue, green, and red wavelength regions was selectively reflected.

Accordingly, different from the organic light emitting element only formed with only the first capping layer 200a, by additionally forming the second capping layer 200b, while the light of the required wavelength band may be selected and reflected, the light of the unnecessary wavelength band may not be reflected, and the color purity of the organic light emitting element may be improved.

For example, the organic light emitting element according to the Comparative Example also may reflect the light of the unnecessary wavelength band, and the color purity may be deteriorated compared with the color purity of the organic light emitting element according to the Example.

The first capping layer 200a may be formed of the organic layer having the refractive index of 1-1.4, the second capping layer 200b may be formed of the organic layer having the refractive index of 1.5-2.5, and by depositing the first and second capping layers 200a and 200b having the different of the refractive indexes, the light to be emitted may be amplified.

An effect according to the thickness of the first capping layer and the second capping layer according to additional Examples will be described with reference to FIG. 4 and FIG. 5.

Figure 4:
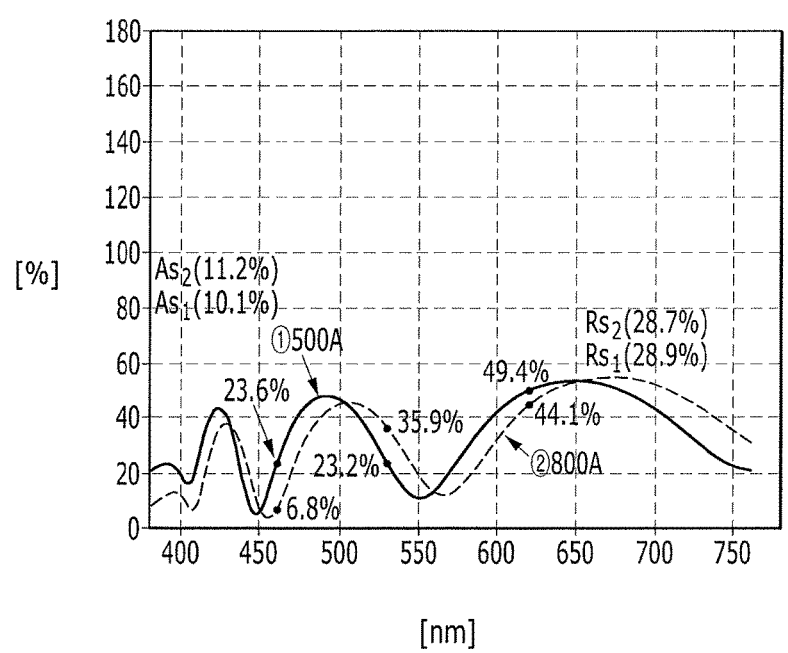
FIG. 4 and FIG. 5 illustrate graphs of a result of measuring reflectance of light for each wavelength measured while changing a thickness of a capping layer of an organic light emitting element according to additional Examples.

FIG. 4 illustrates a graph of the result of measuring the reflectance of the light for each wavelength band measured by forming the first capping layer 200a of the organic light emitting element according to additional Examples with thicknesses of 500 Å ("500 A") and 800 Å ("800 A"). In FIG. 4, the horizontal axis represents the wavelength band (nm) of the light and the vertical axis represents the reflectance (%) of the light.

As shown in FIG. 4, comparing the first capping layer 200a of the thicknesses of 500 Å and 800 Å, the graph representing the reflectance of the wavelength band of the light was shifted right and left, e.g., along the horizontal axis.

The range of the wavelength region of the light to be reflected may be selectively controlled through the thickness of the first capping layer 200a.

For example, as the thickness of the first capping layer 200a is decreased, the graph representing the reflectance of the light for each wavelength band may be shifted left, e.g., along the horizontal axis, and as the thickness of the first capping layer 200a is increased, the graph representing the reflectance of the light for each wavelength band may be shifted moved right, e.g., along the horizontal axis.

The thickness of the first capping layer 200a may be in a range of 200-1,000 Å. If the thickness is less than 200 Å, the formation effect of the first capping layer 200a to increase the reflectance may be slight, while if the thickness is more than 1,000 Å, the absorbed light may be increased compared with the reflected light, and the emission efficiency may be deteriorated.

Figure 5:
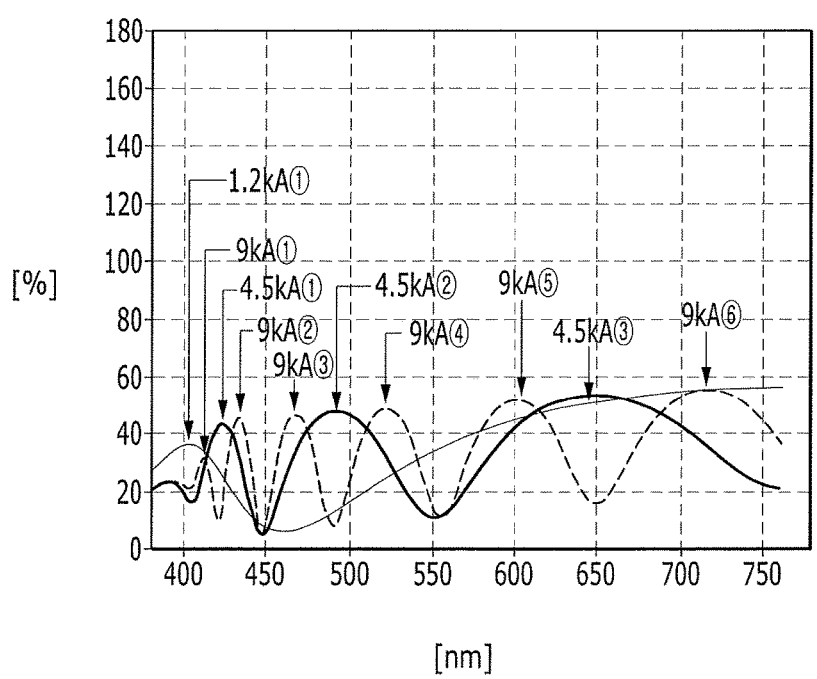

FIG. 5 illustrates a graph of the result of measuring the reflectance of the light for each wavelength band measured by forming the second capping layer 200b of the organic light emitting element according to additional Examples with thickness of 1200 Å ("1.2 kA"), 4,500 Å ("4.5 kA"), and 9,000 Å ("9 kA"). In FIG. 5, the horizontal axis represents the wavelength band (nm) of the light and the vertical axis represents the reflectance (%) of the light.

As shown in FIG. 5, as the thickness of the second capping layer 200b is increased, for example, 1200 Å, 4,500 Å, and 9,000 Å, a number of antinodes and nodes of the graph representing the reflectance of the light for each wavelength band in the limited wavelength (0-750 nm) may be increased.

In the case of 1200 Å, there were two antinodes, in the case of 4,500 Å, there were three antinodes, and in the case of 9,000 Å, there were six antinodes. The number of wavelength regions of the light to be selectively reflected may be controlled through the thickness control of the second capping layer 200b.

For example, whereas the number of antinodes is decreased as the thickness of the second capping layer 200b is decreased, and the number of wavelength regions of the light to be selectively reflected may be decreased, the number of antinodes may be increased as the thickness of the second capping layer 200b is increased, and the number of wavelength regions of the light to be selectively reflected may be increased.

The second capping layer 200b may be formed with the thickness of 4,500-10,000 Å. If the thickness is less than 4,500 Å, there may be less than three antinodes, making it difficult to reflect all the light of three wavelength bands of blue, green, and red, while, if the thickness is more than 10,000 Å, the antinodes may be excessively generated, e.g., an antinode may also be generated in the wavelength region to be removed, and the color purity may be deteriorated.

As described above, the first capping layer 200a and the second capping layer 200b may selectively reflect only light of the wavelength regions of blue, green, and red corresponding to the wavelength regions of the light to be reflected to improve the color purity, and in an exemplary embodiment, the first capping layer 200a may have a thickness of 400-500 Å and the second capping layer 200b may have a thickness of 4,500-6,500 Å.

The wavelength regions of blue, green, and red may best accord, e.g., correspond, with the antinode regions of the graph representing the reflectance for each wavelength band of the light when the first capping layer 200a and the second capping layer 200b are formed with the thickness of the above-described range.

An organic light emitting element according to an exemplary embodiment will be described with reference to FIG. 6 and FIG. 7.

Figure 6:
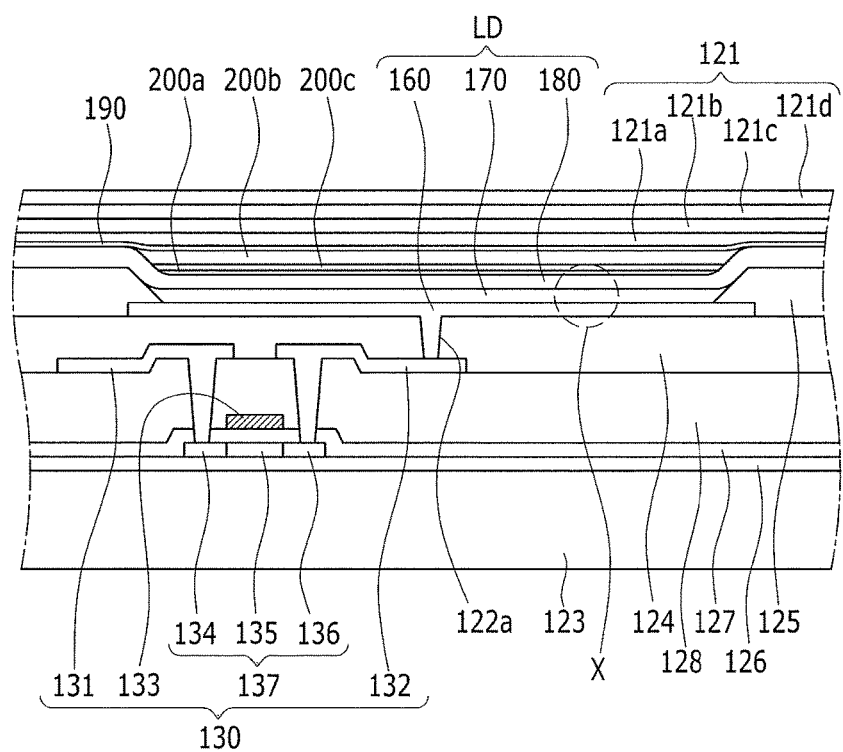
FIG. 6 illustrates a cross-sectional view of an organic light emitting diode (OLED) display based on a thin film transistor and an organic light emitting element used therein in accordance with an exemplary embodiment.

FIG. 6 illustrates a cross-sectional view of an organic light emitting diode (OLED) display based on a thin film transistor and an organic light emitting element used therein in accordance with an exemplary embodiment. FIG. 7 illustrates a partially enlarged cross-sectional view of a part of an organic light emitting element shown in FIG. 6.

Figure 7:
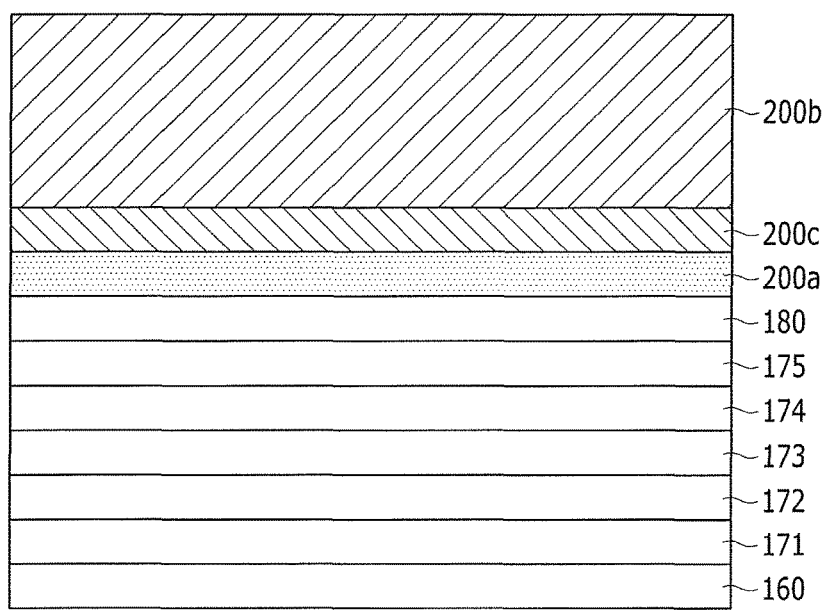
FIG. 7 illustrates a partially enlarged cross-sectional view of a part of an organic light emitting element shown in FIG. 6.

The organic light emitting diode display according to the current exemplary embodiment shown in FIG. 6 and FIG. 7 illustrates substantially the same as an exemplary embodiment shown in FIG. 1 and FIG. 2 except for a third capping layer 200c between the first capping layer 200a and the second capping layer 200b and the refractive indexes of the first to third capping layers 200a, 200b, and 200c.

As shown in FIG. 6 and FIG. 7, the organic light emitting diode display according to an exemplary embodiment further may include the third capping layer 200c inserted between the first capping layer 200a and the second capping layer 200b.

The third capping layer 200c may be formed of the organic layer like the first capping layer 200a and the second capping layer 200b, with a thickness of, for example, 500-1,500 Å, e.g., 1,000-1,300 Å.

The first capping layer 200a may be formed with a thickness of, for example, 200-1,000 Å, e.g., 400-500 Å.

The second capping layer 200b may be formed with a thickness of, for example, 4,000-10,000 Å, e.g., 4,500-6,500 Å.

In an exemplary embodiment, the thickness of the second capping layer 200b may be larger than the thickness of the first capping layer 200a and the third capping layer 200c.

When additionally including the third capping layer 200c, the first capping layer 200a and the second capping layer 200b may have refractive indexes of 1.5-2.5 and the third capping layer 200b may have a refractive index of 1-1.4.

In an exemplary embodiment, the first capping layer 200a and the second capping layer 200b may have a refractive index of 1.8-2.0 and the third capping layer 200c may have a refractive index of 1.2-1.3.

For example, in the sequentially deposited first to third capping layers 200a, 200b, and 200c, they may be deposited while having differences of refractive indexes between adjacent capping layers, and the reflectance of the light may be further improved.

By way of summation and review, a configuration of an OLED display may include a substrate, a pixel electrode located on the substrate, an organic film including an emission layer (EML) located on the pixel electrode, and an opposite electrode located on the organic film. The organic film may include a hole injection layer (HIL) and a hole transport layer (HTL) between the pixel electrode and the emission layer, and an electron transport layer (ETL) and an electron injection layer (EIL) between the EML and a common electrode.

The organic light emitting diode display of the described structure may include an organic emission layer between the anode and the cathode, a hole supplied from the anode may be combined with an electron supplied from the cathode in the organic emission layer to form an exciton, and the light may be emitted by the energy generated while the exciton is again restored into a ground state.

The organic light emitting diode display may determine efficiency according to an optical characteristic of the transparent electrode and the reflecting electrode, and an electrical characteristic of an organic thin film including the emission layer.

In the organic light emitting diode display of a top emissive type, the emission layer may be positioned between the reflective anode and the reflective portion of the transflective cathode, and it may be difficult to obtain a desired emission efficiency and color purity although the thickness of the thin film may be appropriately determined.

Provided is an organic light emitting diode display that may exhibit improved color purity and emission efficiency through control of a thickness of a capping layer formed on the cathode. As described above, according to an exemplary embodiment, by controlling the thicknesses of the capping layers formed on the cathode, the color purity and the emission efficiency may be improved.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a substrate;
a thin film transistor on the substrate;
a first electrode on the thin film transistor and electrically connected to the thin film transistor;
an organic emission layer on the first electrode;
a second electrode on the organic emission layer;
a bi-layer capping layer including a first organic capping layer on the second electrode and a second organic capping layer on the first organic capping layer on the second electrode, the second organic capping layer having a refractive index higher than that of the first organic capping layer;

an overcoat on the second organic capping layer and plurality of organic and inorganic encapsulation layers alternately laminated on the overcoat;

wherein:

the first organic capping layer has a thickness of 400-500 Å, and the second organic capping layer has a thickness of 4,500-6,500 Å.

2. The organic light emitting diode display as claimed in claim 1, wherein:

the first organic capping layer has a refractive index of 1-1.4, and the second organic capping layer has a refractive index of 1.5-2.5.

3. The organic light emitting diode display as claimed in claim 2, wherein:

the first organic capping layer has a refractive index of 1.2-1.3, and the second organic capping layer has a refractive index of 1.8-2.0.

4. The organic light emitting diode display as claimed in claim 1, wherein the organic emission layer includes:

a hole injection layer and a hole transferring layer on the first electrode, an emission layer on the hole transferring layer, and an electron transferring layer and an electron injection layer on the emission layer.

5. The organic light emitting diode display as claimed in claim 4, wherein:

the first electrode is an anode, and the second electrode is a cathode.

6. The organic light emitting diode display as claimed in claim 1, wherein a reflectance of light in red, green and blue light wavelength regions is higher than a reflectance of light in other wavelength regions except for the red, green, and blue wavelength regions.

7. The organic light emitting diode display as claimed in claim 1, wherein as the thickness of the first organic capping layer is increased, a wavelength of red, green and blue light wavelength regions having relatively higher reflectivity is longer.

8. The organic light emitting diode display as claimed in claim 1, wherein as the thickness of the second organic capping layer is increased, a number of antinodes and nodes of a graph representing a reflectance of light for each wavelength band is increased.

* * * * *